(12) United States Patent
Levinson et al.

(10) Patent No.: US 6,178,221 B1
(45) Date of Patent: Jan. 23, 2001

(54) LITHOGRAPHY REFLECTIVE MASK

(75) Inventors: Harry Levinson, Saratoga; Khanh B. Nguyen, San Mateo, both of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/205,790

(22) Filed: Dec. 4, 1998

(51) Int. Cl.$^7$ .................................................. G21K 5/00
(52) U.S. Cl. ................................ 378/35; 378/34; 378/35; 430/5
(58) Field of Search ............................ 378/34, 35; 430/5

(56) References Cited

U.S. PATENT DOCUMENTS 3,443,915 * 5/1969 Wood et al. ............................ 29/194

* cited by examiner

*Primary Examiner*—David P. Porta
*Assistant Examiner*—Daniel S. Felten
(74) *Attorney, Agent, or Firm*—Renner, Otto, Boiselle & Sklar, LLP

(57) ABSTRACT

A reflective lithography mask (12) including a substrate (40); a reflective coating (42); a plurality of absorbing blocks (44) covering certain regions of the reflective coating (42) in a manner corresponding to a desired circuit pattern; and a plurality of buffer blocks (46) situated between the covered regions of the reflective coating and the absorbing blocks. The buffer blocks (46) are made of an electrically conducting material, such as carbon in graphite form; tin oxide (and materials based on this compound) and/or indium oxide (and materials based on this compound). Since the buffer material is electrically conducting, rather than insulating, the risk of electrostatic discharge damage is reduced.

21 Claims, 2 Drawing Sheets

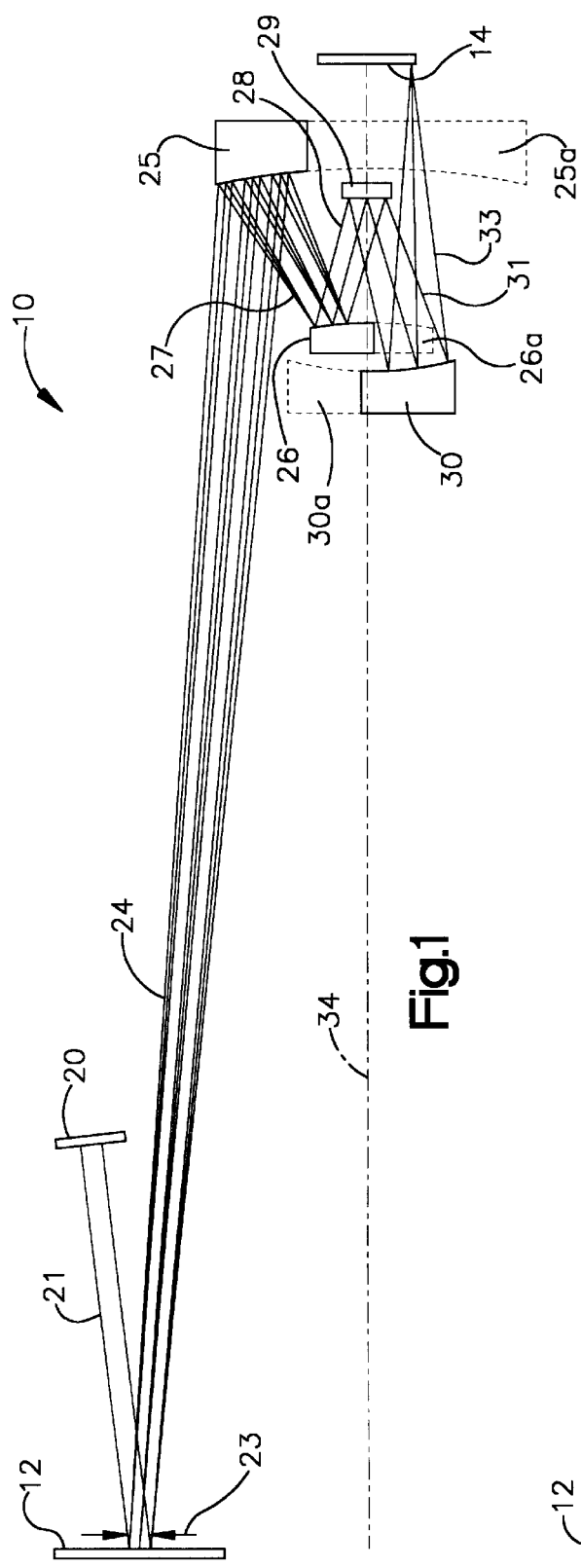
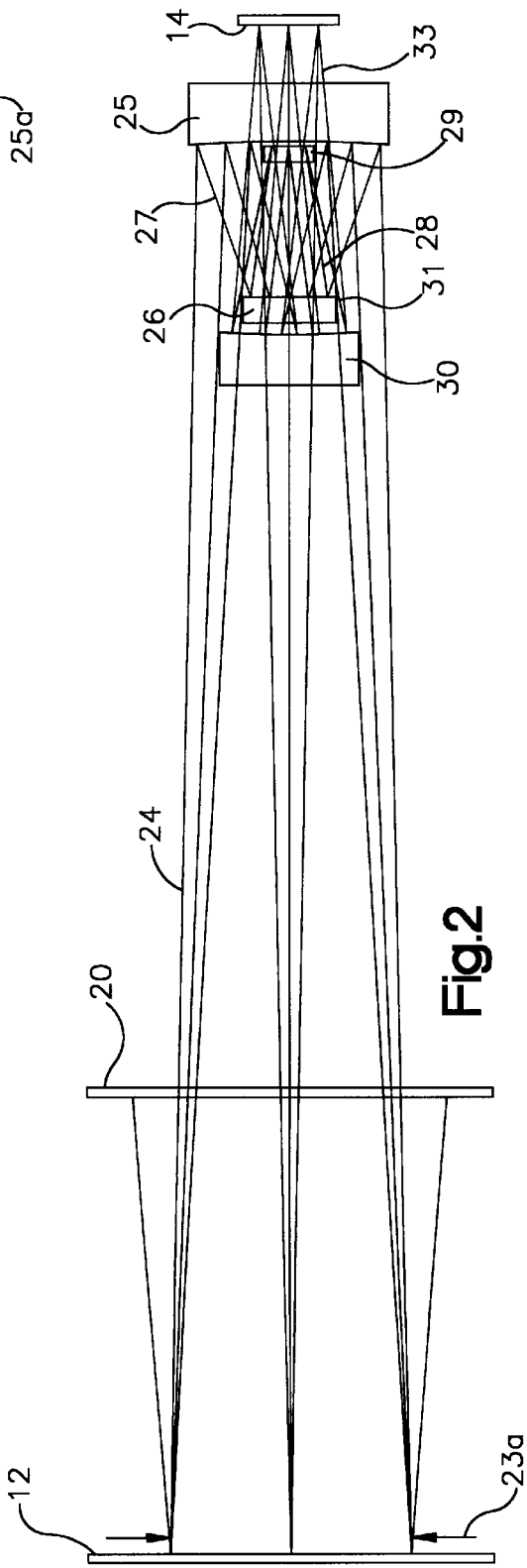
Fig.1
Fig.2

LITHOGRAPHY REFLECTIVE MASK

FIELD OF THE INVENTION

This invention relates generally to a reflective mask for use in a lithography method, such as an extreme ultraviolet lithography method.

BACKGROUND OF INVENTION

Integrated circuit fabrication techniques vary greatly depending on the specific chip structure being made, the exact processes being used, and/or the available equipment.

However, almost all fabrication methods include a lithography process during which certain regions of a wafer (i e., a silicon slice coated with a photoresist material) are exposed to radiation to delineate a latent image corresponding to the desired circuit pattern. The radiation-exposed wafer is then developed, etched, and processed to form an integrated circuit.

The technical advances in lithography processes have been significant. Integrated circuits built to design rules at or slightly below 0.25 $\mu$m are common with the use of radiation in the deep ultraviolet wavelength. Radiation in the extreme ultraviolet (EUV) range (3 nm to 50 nm wavelength—also referred to as "soft x-ray") has been found useful for the fabrication of devices having design rules of 0.18 $\mu$m and is prospectively useful for even smaller design rules, such as 0.10 $\mu$m and smaller.

During the past eight years, EUV lithography has evolved from a simple concept into a possible candidate for mass commercial production of integrated circuits. Projection lithography, and particularly reflective (rather than transmission) projection lithography, is believed to be the best route to industrial production of integrated circuits by use of EUV lithography. In such a system, EUV radiation is projected onto a lithography mask having reflective regions and non-reflective regions corresponding to the desired circuit pattern. The beams reflected from the mask are then demagnified and projected onto the wafer.

Of particular interest in the present invention is the reflective mask used in EUV projection lithography. A reflective EUV lithography mask typically comprises a substrate, a reflective coating on a top surface of the substrate, and a plurality of absorbing blocks covering certain regions of the reflective coating in a manner corresponding to a desired circuit pattern. A reflective mask may also include buffer blocks situated between the covered regions of the reflective coating and the absorbing blocks.

A method of making a reflective lithography mask typically comprises the steps of applying the reflective coating onto the substrate and then applying a buffer layer on the reflective coating to create a reticle blank. The absorber blocks are then arranged on the buffer layer in a manner corresponding to a desired circuit pattern by, for example, depositing an absorber layer on the buffer layer and etching certain portions of the absorber layer to form the absorber blocks. The uncovered regions of the buffer layer are then removed, usually by etching, to create a plurality of buffer blocks situated between block-covered regions of the reflective coating and the absorbing blocks. Accordingly, the buffer material must remain intact during creation of the absorbing blocks while at the same time must be able to be removed from the uncovered regions of the reflective coating without damaging the coating.

Reflective masks may have a tendency to accumulate and retain static electric charge when exposed to intense actinic radiation, such as during the EUV lithography session. At the very least, this static charge attracts dust which may interfere with the exposure of the mask. Moreover, perhaps more importantly, an electrostatic discharge ("ESD") will occur when the electrostatic charge becomes substantial enough to overcome a dielectric material between the charge and another surface of lower electrical potential. Electrostatic discharge can cause permanent or costly damage to an already expensive EUV reflective mask.

Accordingly, the inventor appreciated that a need remains for a reflective lithography mask which is designed to reduce the risk of electrostatic discharge damage.

SUMMARY OF THE INVENTION

The present invention pertains to a reflective lithography mask which is designed to reduce the risk of electrostatic discharge by providing a buffer layer that is electrically conductive. An oxide material is usually the buffer material of choice because it remains intact during absorber-etching while at the same time may be removed (i.e., etched) from the uncovered regions of the reflective coating without damaging the coating. However, since such oxide materials are insulators, they increase the risk of electrostatic discharge damage by providing a dielectric material between the charged absorber blocks and the coating/substrate. Accordingly, the present invention reduces this risk by replacing the insulating buffer layer with an electrically conductive buffer layer.

More particularly, the present invention provides a reflective lithography mask comprising a substrate; a reflective coating on a top surface of the substrate; a plurality of absorbing blocks covering certain regions of the reflective coating in a manner corresponding to a desired circuit pattern; and a plurality of buffer blocks situated between the covered regions of the reflective coating and the absorbing blocks. The buffer blocks are made of an electrically conducting material, such as carbon in an electrically conductive graphite form; tin oxide and indium oxide and materials based on these compounds).

Preferably, the reflective coating is a multi-layer mirror comprising layers of high and low refractive index materials introducing a phase delay of one or more wavelengths so that a composite reflection is single phase. For example, the multi-layer mirror may comprise layers of silicon and molybdenum; molybdenum and beryllium; or ruthenium and boron carbide. Additionally or alternatively, the absorbing blocks are made at least partially of a high absorption material, such as gold; germanium; tungsten; tantalum; titanium; or titanium nitride.

The reflective mask may be used in a lithography method (preferably, but not necessarily an EUV lithography method) to delineate a latent image of a desired circuit pattern (preferably having design rules of 0.25 $\mu$m and less) onto a wafer. In this lithography method, the mask is illuminated with radiation (preferably having a wavelength of 3 nm to 50 nm) and the radiation is reflected from the reflective regions of the mask onto the wafer A method of making a reflective lithography mask according to the present invention comprises the steps of applying the reflective coating onto the substrate and then applying an electrically conductive buffer layer onto the reflective coating to form a reticle blank. The absorber blocks are then arranged on the buffer layer in a manner corresponding to a desired circuit pattern. This block-arrangement is preferably accomplished by depositing an absorber layer on the buffer layer and then etching certain portions of the absorber layer to form the absorber blocks. The uncovered regions of the buffer layer are then removed, preferably by etching, to create the electrically conductive buffer blocks situated between the block-covered regions of the reflective coating and the absorbing blocks.

The step of removing (ie., etching) the absorber layer is performed without substantially etching the buffer layer. The step of removing (i. e., etching) the buffer layer is performed without substantially etching (or damaging) the reflective coating. Accordingly, the electrically conductive buffer material and/or the etching techniques are chosen to accomplish these objectives. For example, with a carbon graphite buffer layer, the absorber layer could be removed with a non-oxygen plasma etching technique and the buffer layer could be removed with an oxygen plasma etching process.

These and other features of the invention are fully described and particularly pointed out in the claims. The following description and drawings set forth in detail a certain illustrative embodiment of the invention, this being indicative, however, of but one of the various ways in which the principles of the invention may be employed.

DRAWINGS

FIGS. 1 and 2 eschematic side and top views, respectively, of an EUV lithography system incorporating a reflective mask according to the present invention.

DETAILED DESCRIPTION

Figure 3:
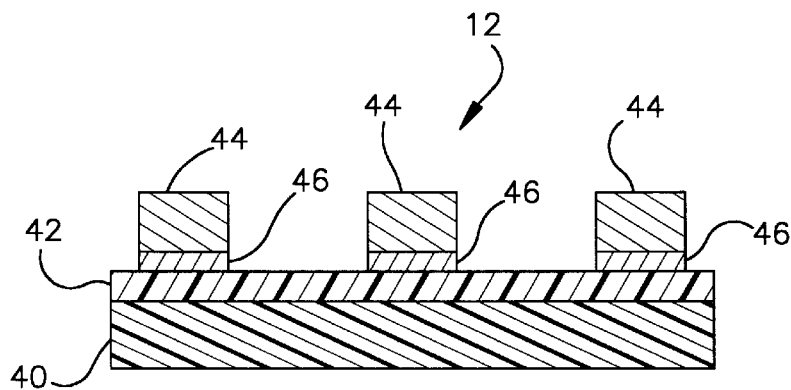
FIG. 3 is a fragmentary cross-sectional view of a portion of the reflective mask.

Referring now to the drawings in detail and initially to FIGS. 1 and 2, an EUV lithography system 10 incorporating a reflective mask 12 according to the present invention is schematically shown. As is explained in more detail below, the mask 12 is designed to reduce the risk of electrostatic discharge damage.

The system 10 is designed to delineate a latent image of a desired circuit pattern (having feature dimensions of 0.25 $\mu$m and less) onto a wafer 14 by illuminating the reflective mask 12 to thereby reflect radiation onto the wafer 14. The radiation-exposed wafer is then developed, etched, and processed to form an integrated circuit. To this end, the wafer 14 is fabricated to allow the latent image to be created thereon while at the same time allowing subsequent etching to be performed. For example, the wafer 14 may comprise a silicon substrate having one side coated in sequential order with an organic material, germanium, and an EUV-sensitive material. The EUV-sensitive material coating, which forms the exposure side of the wafer, is sufficiently thin to allow full absorption of EUV radiation so that the entire thickness of the radiation-exposed areas of the wafer will be removed during development. The underlying germanium and organic material coatings serve in succession as barriers during the etching steps. Such a tri-level coating is disclosed in "Use of Trilevel Resist for Soft X-ray Projection Lithography", D.W. Berreman, et al., *Appl. phys. Lett.,* vol. 56(22), 28 (1990), the entire disclosure of which is hereby incorporated by reference.

The lithography system 10 includes an EUV radiation source 20 producing a beam 21 having a wavelength of 3 nm to 50 nm. FIGS. 1 and 2 are simplified schematic representations of such a system whereby certain components are not specifically shown. For example, the source 20 may be a synchrotron or a laser plasma source and preferably includes optical filtering elements and a condenser. Also, the reflective mask 12 and the wafer 14 are preferably mounted to stages and a scanner scans the mask 12 and the wafer 14 at relative speeds corresponding to the desired mask-to-image reduction.

In the illustrated system 10, the radiation source 20 produces a beam 21 that illuminates the reflective mask 12 over a slit having a width 23 and a length 23a. The diverging beam 24 reflected therefrom is reflected by a concave mirror 25 so as to illuminate a convex mirror 26 with the now converging beam 27. Reflection of the beam 27 from the convex mirror 26 results in a beam 28 which illuminates a concave folding mirror 29. This results in the illumination of a concave mirror 30 by a now diverging beam 31. The beam 31 illuminates a mirror 30 to produce a focused image on the wafer 14 by means of a beam 33 to thereby expose certain portions of the wafer to EUV radiation. Further details of the optical aspects of the lithography system 10 are set forth in U.S. Pat. No. 5,315,629, the entire disclosure of which is hereby incorporated by reference.

Referring now to FIG. 3, the reflective mask 12 according to the present invention is shown. The mask 12 comprises a substrate 40 that may be made of any suitable material. Silicon is usually the substrate material of choice since the top surface of a silicon slice may be polished to have excellent surface flatness specifications. Alternatively, for temperature stability, the substrate may be made of a low expansion glass, such as a mixed glass composition of 92.6 wt. % $SiO_2$ 7.4 wt. % $TiO_2$.

The mask 12 also comprises a reflective coating 42 that is preferably a multi-layer mirror having layers of high and low refractive index materials that introduce a phase delay of one or more wavelengths so that the composite reflection is single phase. In other words, the reflective coating 42 is preferably a Distributed Braggs Reflector (DBR). Silicon/ molybdenum multi-layer mirrors may be used in the 13 nm–15 nm wavelength range; molybdenum/beryllium multi-layer mirrors may be used in the 11.4 nm wavelength range; and ruthenium/boron carbide multi-layer mirrors may be used in the 6.8 nm wavelength range. Such multi-layer mirrors, and their contribution to the evolution of EUV lithography, are discussed in "EUV Lithography", A.M. Hawryluk, et al., *Solid State Technology,* vol 40 (7), 154 (1997) and this discussion is hereby incorporated by reference.

The mask 12 additionally comprises a plurality of absorbing blocks 44 that are shaped, sized and arranged to cover regions of the reflective coating 42 in a manner corresponding to the desired circuit pattern. In this manner, the imaging surface of the mask 14 has reflective regions (the uncovered regions of the coating 42) and non-reflective regions (the blocks 44). The blocks 44 may be made primarily of a high absorption material, such as gold, germanium, tungsten, tantalum, titanium, titanium nitride, etc. Alternatively, the absorbing blocks 44 may be made of a combination of such high absorption materials and phase-shifting materials, such as is suggested in U.S. Pat. No. 5,510,230, the entire disclosure of which is hereby incorporated by reference.

The mask 12 further comprises a plurality of electrically conductive buffer blocks 46 situated between the covered regions of the reflective coating 42 and the absorbing blocks 44. The buffer blocks 46 are made of a material that, in addition to being electrically conductive, also meets the standard requirements for a mask buffer layer. Specifically, as is explained in more detail below, the buffer material must remain intact during creation of the absorbing blocks 44 while at the same time must be able to be removed from the uncovered regions of the reflective coating 42 without damage thereto. Accordingly, the preferred buffer material will vary depending on the absorber material and/or the mask-making steps. In certain situations, carbon in graphite form may be the preferred electrically conductive buffer material. In other situations, tin oxide and indium oxide, and materials based on these compounds (such as antimony-doped tin oxide, tin-doped indium oxide, and materials in the system indium-tin-oxide) may be the preferred electrically conductive buffer material.

Figure 4A:
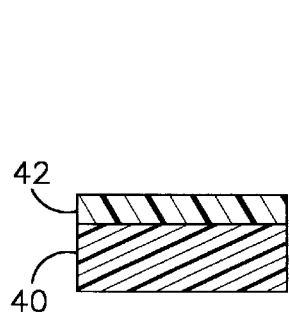
FIGS. 4A–4E are schematic illustrations of a method of making the reflective mask.
Figure 4B:
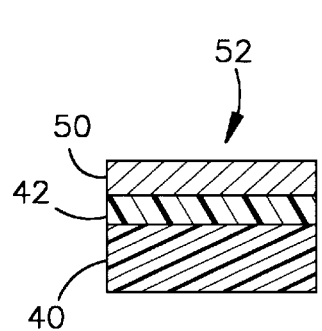
Figure 4C:
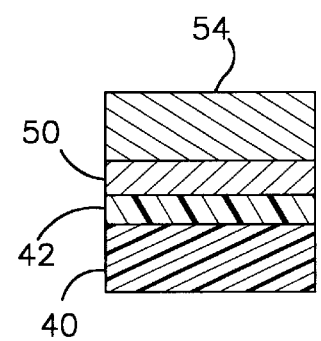

Referring now to FIGS. 4A–4E, a method of making the mask 12 is schematically shown. In this method, the first step is applying the reflective multi-layer mirror coating 42 to the top surface of the substrate 40. (FIG. 4A.) Optimum optical properties are obtained when the individual mirror layers are smooth, the transition between the different mirror materials is abrupt, and the layer-to-layer thickness variation is maintained with 0.01 nm. The favored technique for deposition is magneton sputtering and has proven successful in producing coatings meeting these specification.

An electrically conductive buffer layer 50 is then applied to the coating 42 to create a reticle blank 52, preferably by sputtering. Methods for carbon deposition by sputtering, (typically DC magnetron sputtering wherein ionized gases are directed onto the target by magenetic fields established in a low-pressure argon atmosphere in a sputtering device) are set forth in U.S. Pat. Nos. 4,417,175; 5,567,512; and 5,679,431, the entire disclosures of which are hereby incorporated by reference. Methods for depositing tin oxide and indium oxide (and materials based on these compounds) are set forth in Fraser et. al, Highly Conductive, Transparent Films of Sputtered $In_{2-x}Sn_xO_{3-y}$. *Journal of the Electrochemical Society*, Vol. 119, No. 10, 1368–1374 (1972), the entire disclosure of which is hereby incorporated by reference.

Figure 4D:
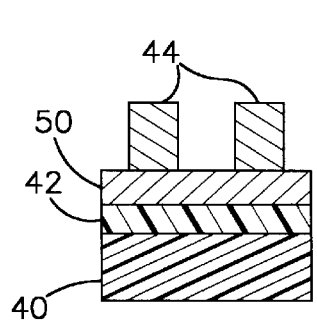

An absorber overlayer 54 is then applied to the reticle blank 52 (FIG. 4C) and the absorber blocks 44 are patterned from this absorber overlayer 54 (FIG. 4D). These steps may be accomplished by electron beam writing or ion beam sputter deposition, followed by etching, such as is explained in A.M. Hawryluk, et al., "EUV Reticle Pattern Repair Experiments Using 10 Kev Neon Ions," *OSA Proceedings on Extreme Ultraviolet Lithography*, Vol. 23, 1994; D. Tennent, et al., "Mask Technologies for Soft X-ray Projection Lithography," *Applied Optics*, Vol. 32, No. 34, p.7007, 1993 and S. Vernon, et al., and/or "Reticle Blanks for EUV Lithography: Ion beam sputter deposition of low defect density Mo/Is Multilayers, "OSA TOPS on *Extreme Ultraviolet Lithography*, Vol. 4, 1996. The entire disclosures of these articles are hereby incorporated by reference.

Figure 4E:
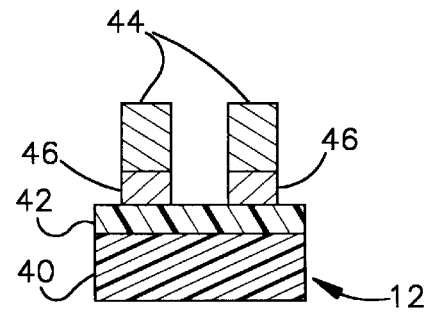

The regions of the buffer layer 50 uncovered by the absorbing blocks 44 are then removed (i.e., etched) to expose the uncovered regions of the reflective coating 42, thereby creating the buffer blocks 46. (FIG. 4E.) If the buffer layer 50 is transparent (i.e., if the buffer material is a transparent material such as tin oxide and indium oxide and certain compounds based thereon), this last step of the method may be omitted. While EUV lithography methods will usually require removal of this buffer layer 50, other lithography methods may not. In any event, if the buffer-removing step is omitted, the mask 12 will include buffer blocks 46 integral with the buffer layer 50 extending over the reflective coating 42.

During the creation of the absorbing blocks (i.e., deposit of the absorber layer 54 and the etching thereof), the buffer layer 50 protects the reflective coating 42 from damage. To this end, the buffer material and/or the absorber etching material must be chosen so that the buffer layer 50 is not removed during the absorber etching steps. By the same token, the buffer material and/or the buffer etching material must be chosen so that the reflective coating 42 will not be etched or otherwise damaged when the uncovered regions of the buffer layer 50 are removed.

By way of a specific example, carbon graphite etches slowly in most plasma etches, except oxygen plasma etches. Also, oxygen plasmas have a negligible effect on the preferred reflective coatings 42. Accordingly, if the buffer layer 50 is made of carbon graphite, the absorber removal steps could be performed with a non-oxygen plasma etching process thereby leaving the buffer layer 50 intact. The buffer removal steps could be performed with an oxygen plasma etching process thereby leaving the reflective coating 42 undamaged.

Accordingly, one may now appreciate that the present invention provides a reflective lithography mask 12 that reduces the risk of electrostatic discharge by making the mask's buffer electrically conductive. Although the invention has been shown and described with respect to a preferred embodiment, other equivalent modifications and alterations will occur to those skilled in the art. The invention includes all such modifications and alterations and is limited only by the scope of the following claims.

What is claimed is:

1. A reflective lithography mask comprising:
   a substrate;
   a reflective coating on a top surface of the substrate;
   a plurality of absorbing blocks covering certain regions of the reflective coating in a manner corresponding to a desired circuit pattern; and
   a plurality of electrically conductive buffer blocks situated between the covered regions of the reflective coating and the absorbing blocks.

2. A reflective lithography mask as set forth in claim 1 wherein the buffer blocks are integral with a buffer layer extending over the reflective coating.

3. A reflective mask as set forth in claim 1 wherein the buffer blocks are made from a material comprising carbon graphite.

4. A reflective mask as set forth in claim 1 wherein the buffer blocks are made from a material represented by the formula $In_{2-x}S_{n-x}O_{3-y}$, where x can vary from zero to two and y from zero to 0.02.

5. A reflective mask as set forth in claim 1 wherein the buffer blocks are made from a material comprising a carbon graphite or a material represented by the formula $In_{2-x}S_{n-x}O_{3-y}$, where x can vary from zero to two and from zero to 0.02.

6. A reflective lithography mask as set forth in claim 5 wherein the reflective coating is a multi-layer mirror.

7. A reflective lithography mask as set forth in claim 6 wherein the multilayer mirror comprises layers of high and low refractive index materials introducing a phase delay of one or more wavelengths so that a composite reflection is single phase.

8. A reflective lithography mask as set forth in claim 7 wherein the layers of the multi-layer mirror comprise layers selected from one of a group consisting of:
   silicon and molybdenum;
   molybdenum and beryllium; and
   ruthenium and boron carbide.

9. A reflective lithography mask as set forth in claim 8 wherein the absorbing blocks are made at least partially of a high absorption material selected from a group consisting of gold, germanium, tungsten, tantalum, titanium, and titanium nitride.

10. A reflective lithography mask as set forth in claim 5 wherein the absorbing blocks are made at least partially of a high absorption material selected from a group consisting of gold, germanium, tungsten, tantalum, titanium, and titanium nitride.

11. A blank for a reflective lithography mask comprising a substrate, a reflective coating on the substrate, and an electrically conducting buffer layer over the reflective coating;
   wherein the buffer layer is made of material selected from a group consisting of:
      carbon in graphite form,
      tin oxide and material based on this compound, and
      indium oxide and materials based on this compound; and
   wherein the reflective coating comprises a multi-layer mirror having layers selected from one of a group consisting of:
      silicon and molybdenum;
      molybdenum and beryllium; and
      ruthenium and boron carbide.

12. A method of making a reflective lithography mask comprising the steps of:
   applying a reflective coating on a substrate;
   applying an electrically conductive buffer layer on the reflective coating;
   arranging absorber blocks on the buffer layer in a manner corresponding to a desired circuit pattern.

13. A method as set forth in claim 12 further comprising the step of removing uncovered regions of the buffer layer to create a plurality of electrically conductive buffer blocks situated between block-covered regions of the reflective coating and the absorbing blocks.

14. A method as set forth in claim 13 wherein said removing step comprises etching the uncovered regions of the buffer layer without substantially etching the reflective coating.

15. A method as set forth in claim 12 wherein said arranging step comprises depositing an absorber layer on the buffer layer and etching certain portions of the absorber layer to form the absorber blocks without substantially etching the buffer layer.

16. A method as set forth in claim 14 wherein said arranging step comprises depositing an absorber layer on the buffer layer and etching certain portions of the absorber layer to form the absorber blocks without substantially etching the buffer layer.

17. A method as set forth in claim 16 wherein the buffer layer comprises a carbon graphite material; wherein the absorber-etching step comprises an non-oxygen plasma etching step; and wherein the buffer-etching step comprises an oxygen plasma etching process.

18. A lithography method for delineating a latent image of a desired circuit pattern onto a wafer, comprising the step of illuminating the reflective lithography mask set forth in claim 1 with radiation so as to reflect radiation from the reflective regions of the mask onto the wafer.

19. A lithography method as set forth in claim 18 wherein the desired circuit pattern has feature dimensions of 0.25 $\mu$m and less.

20. A lithography method as set forth in claim 18 wherein the radiation has a wavelength of 3 nm to 50 nm.

21. A lithography method as set forth in claim 20 wherein the desired circuit pattern has feature dimensions of 0.25 $\mu$m and less.

* * * * *